United States Patent [19]

Son

[11] Patent Number: 5,202,282
[45] Date of Patent: Apr. 13, 1993

[54] METHOD FOR PRODUCING A SELF-ALIGNMENT TYPE CCD SENSOR

[75] Inventor: Dong K. Son, Kyungki, Rep. of Korea

[73] Assignee: Goldstar Electron Co., Ltd., Rep. of Korea

[21] Appl. No.: 728,199

[22] Filed: Jul. 10, 1991

[30] Foreign Application Priority Data

Jul. 10, 1990 [KR] Rep. of Korea .............. 10423/1990

[51] Int. Cl.⁵ .................. H01L 21/339; H01L 21/72
[52] U.S. Cl. ........................................ 437/53; 437/3; 437/192; 437/200; 437/201
[58] Field of Search .................. 437/2, 3, 4, 50, 53, 437/192, 200, 201; 148/DIG. 19, DIG. 147

[56] References Cited

U.S. PATENT DOCUMENTS

| | | | |
|---|---|---|---|
| 4,590,093 | 5/1986 | Woerlee et al. | 437/201 |
| 4,679,301 | 7/1987 | Blanchard et al. | 148/DIG. 147 |
| 4,746,622 | 5/1988 | Hawkins et al. | 437/53 |
| 4,766,089 | 8/1988 | Davids et al. | 437/53 |
| 4,804,438 | 2/1989 | Rhodes | 437/201 |
| 4,968,646 | 11/1990 | Blanchard et al. | 437/200 |

OTHER PUBLICATIONS

Kuriyama, et al., IEEE Transactions on Electronic Devices, vol. 38, No. 5, pp. 949-953 (May 1991).
Mitsubishi Electronics Ind. Co., Ltd., Japanese TV Society Brochure, vol. 10, No. 4, pp. 55-59 (Apr. 1990).

Primary Examiner—Brian E. Hearn
Assistant Examiner—C. Chaudhari

[57] ABSTRACT

A process for producing a CCD image sensor comprising the steps of: providing a light-receiving photo-diode region and a VCCD transmission region by injecting ions into a substrate at a predetermined distance, the injected ions being different in type from the substrate, covering the surface of the substrate with a gate oxide layer and a gate polysilicon layer, the gate polysilicon layer being deposited over the gate oxide layer, then removing the gate polysilicon layer only from the region over the light-receiving region, depositing a refractory metal layer over the whole etched surface by vacuum evaporation and then annealing the refractory metal into a silicide in the region thereof which is in contact with the gate polysilicon and removing the refractory metal from the unconverted portion of the refractory metal layer which overlies the gate oxide layer. In this process, a fill factor of the light-receiving region is maximized as a window is provided in the light-receiving region by self-alignment, and smear is prevented as silicide completely covers the gate polysilicon layer including even the side faces thereof.

15 Claims, 3 Drawing Sheets

METHOD FOR PRODUCING A SELF-ALIGNMENT TYPE CCD SENSOR

BACKGROUND OF THE INVENTION

This invention relates to a method for producing a self-alignment or self aligning type CCD image sensor. More particularly, to a method for producing a CCD image sensor wherein the effective area the light-receiving region is undiminished and incident light impinges only upon the light-receiving region, with the remaining regions of the sensor completely shielded from the incident light, thereby preventing smearing.

In general, a CCD image sensor is a dynamic element in which a signal charge moves along a predetermined route under the control of clock pulses, and the sensor generally comprises a light-receiving region and a transmission region for transferring a signal charge corresponding to incident light. The CCD image sensor has widely been used in memory, logic, signal processing or image processing devices.

One of the prior art CCD image sensors has a light-shielding layer of metal material such as aluminum for assuring that light can be incident only on the light-receiving region.

Such prior art CCD image sensors have been proposed by Mitsubishi Electronics Ind. Co., Ltd. in the Japanese TV Society brochure (Vol. 10, No. 4, Apr., 1990).

The process for producing the prior art CCD image sensor having a light-shielding layer of metal material is hereinafter described with reference to FIGS. 1(A) through (D).

As shown in FIG. 1(a), n-type ions are injected into a silicon substrate 1 at predetermined regions thereof at a predetermined distance to constitute a photo diode 2 for serving as a light-receiving region and a vertical charge coupled device (VCCD) for serving as a transmission region for transferring signal charges. The whole surface of the substrate 1 is covered with a gate oxide layer 4 and a gate polysilicon layer 5, the latter being over the former layer. Thereafter, the gate polysilicon layer 5 is removed from the portion over the photo diode 2 through conventional photo and etching processes.

Thereafter, as shown in FIG. 1(B), a Boron Phosphorous Silicate Glass (BPSG) film of a predetermined thickness for serving as an insulation film, is spread on the etched surface, and subsequently covered with a light-shielding layer 7 of aluminum of a predetermined thickness as shown in FIG. 1(C).

It is noted that a low temperature oxide (LTO) film can be used instead of the BPSG film.

The next step is to eliminate the light-shielding layer 7 only at the portion over the photo diode through conventional photo and etching processes for assuring that light is incident only upon the photo diode 2 (see FIG. 1(D)).

The reason why aluminum is typically used as the material for forming the light-shielding layer, is that aluminum is widely used in memory or bipolar elements and it is particularly suitable for use as a light-shielding layer because of its high reflectivity (approximately 100%).

However, the above-mentioned prior art suffers from the following disadvantages.

Firstly, elimination of the light-shielding layer 7 only from the region over the photo diode 2 results in the infiltration of light into the BCCD 3 through the remaining gate polysilicon layer 5, thus producing the appearance of smear (see FIG. 2).

Secondly, the stack structure of the gate polysilicon layer 5 and the light-shielding layer 7 makes it difficult to accomplish the photo and etching process for eliminating the light-shielding layer only at the portion over the photo diode 2, whereby the light-shielding layer 7 may extend into the region above the photo diode 2. Accordingly, the opening area of the photo diode 2 is decreased by 2Y, resulting in an undesirable decrease of the fill factor of the sensor.

SUMMARY OF THE INVENTION

An object of the present invention to overcome the above disadvantages, is to provide a method for producing a CCD image sensor wherein the light-receiving area does not decrease and the appearance of an optical smear phenomenon is prevented. In accordance with the above object, the present invention provides a process for producing a self-alignment type CCD image sensor comprising the steps of providing a light-receiving photo-diode region and a VCCD transmission region by injecting ions into a substrate at a predetermined distance, the injected ions being different in type from the substrate, covering the surface of the substrate with a gate oxide layer and a gate polysilicon layer, the gate polysilicon layer being deposited over the gate oxide layer, then removing the gate polysilicon layer only from the region over the light-receiving region, depositing a refractory metal layer over the whole etched surface by vacuum evaporation and then annealing the refractory metal into a silicide in the region thereof which is in contact with the gate polysilicon and removing the refractory metal from the unconverted portion of the refractory metal layer which overlies the gate oxide layer.

For a further understanding of the invention and further objects, features and advantages thereof, reference may now be had to the following description taken in conjunction with the accompanying drawings.

DETAILED DESCRIPTION OF THE PREFERRED EMBODIMENT

Figure 1A:
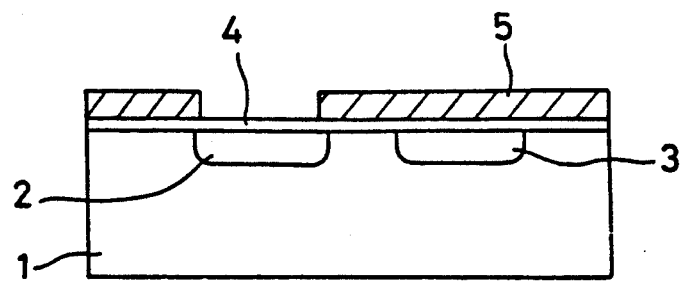
FIGS. 1(A) through (D) are sectional views of the process for producing the prior art CCD image sensor.
Figure 1B:
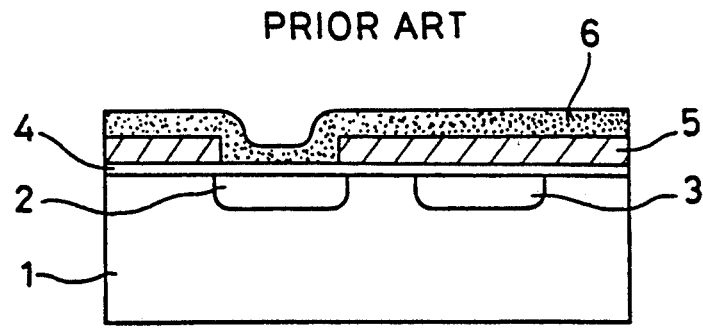
Figure 1C:
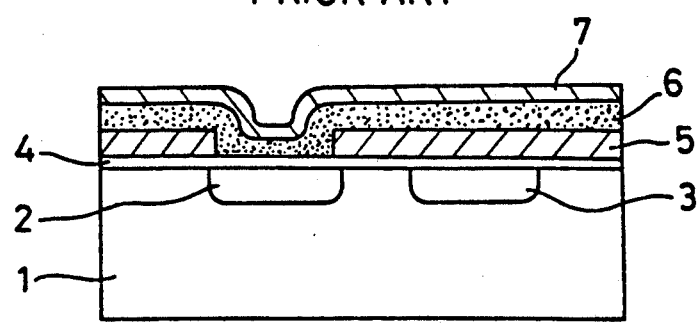
Figure 1D:
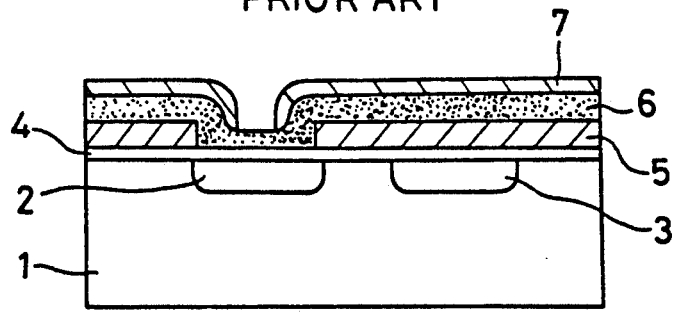
Figure 2:
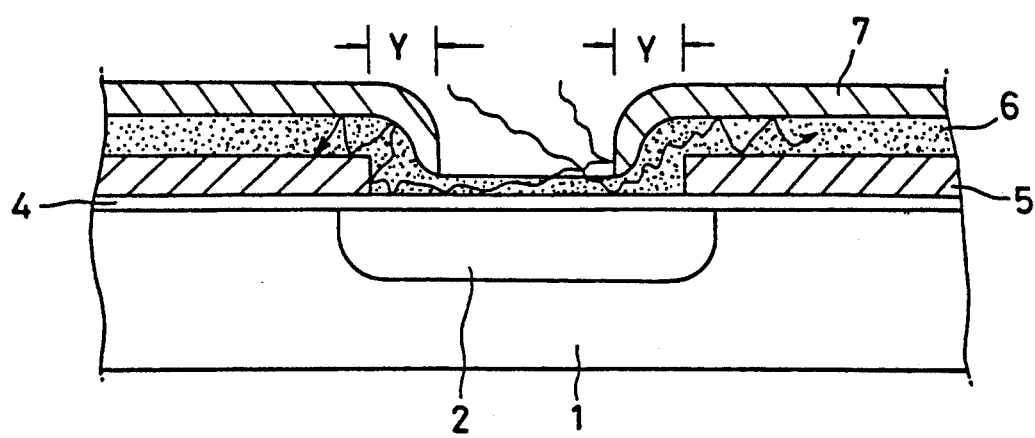
FIG. 2 illustrates the appearance of smear in the conventional CCD image sensor.
Figure 3A:
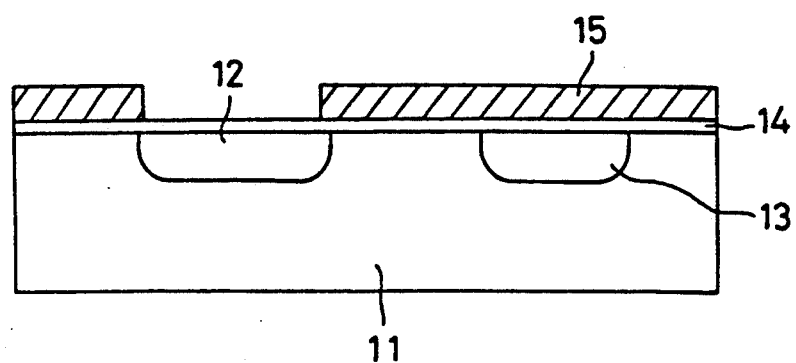
FIGS. 3(A) through (D) are sectional views of the process of the present invention.

FIGS. 3(A) through (D) disclose a preferred embodiment of the present invention. As shown in FIG. 3(A), n-type ions are injected into a p-type silicon substrate 11 to a predetermined depth over a predetermined area to form a photo diode 12 for serving as a light-receiving region and a vertical charge coupled device (VCCD) 13 for serving as a transmission region.

A Schottky diode can be used instead of the photo diode 12. The VCCD 13 may alternatively be embodied as a buried charge coupled device (BCCD).

A layer of gate oxide 14 and a layer of gate polysilicon 15 cover the whole surface of the silicon substrate 11, the latter layer being over the former layer.

Gate oxide as referred to herein means $SiO_2$. In the preferred embodiment of the method herein, the gate oxide is formed by thermally oxidizing the silicon substrate at a temperature between 900° C. and 1,000° C. under either an oxygen rich atmosphere or an atmosphere rich in both oxygen and hydrogen. The thickness of the oxide layer in the preferred embodiment is about 1,000 Angstroms.

Gate polysilicon or poly-si is applied by a LPCVD (Low Pressure Chemical Vapor Deposition) process by thermally decomposing silane $SiH_4$ at a temperature of about 600° C. In the preferred embodiment of the inventive method, the gate polysilicon is deposited to a thickness of about 2,000 Angstroms.

The gate polysilicon 15 is selectively eliminated at, or removed from the region over the photo diode 12 through photo and etching processes to provide a window, whereby light can be incident upon the photo diode 12. Polysilicon can be etched selectively by a reactive ion etching process (dry etching) using either chlorine gas $Cl_2$ or He or other suitable reactive gases at room temperature and pressure with a plasma beam power of about 300 watts.

Figure 3B:
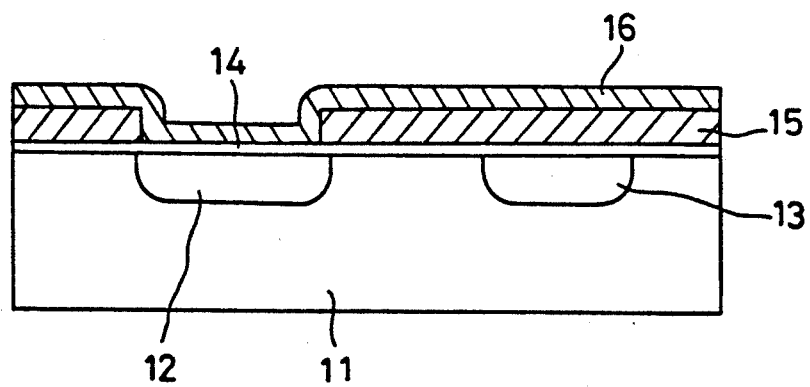

Thereafter, refractory metal 16 such as Ti, Mo or Pt, of a predetermined thickness is deposited to a thickness of about 1,500 Angstroms over the whole surface of the etched gate polysilicon 15, as shown in FIG. 3(B) through a physical vapour deposition (PVD) process or a sputtering process.

Figure 3C:
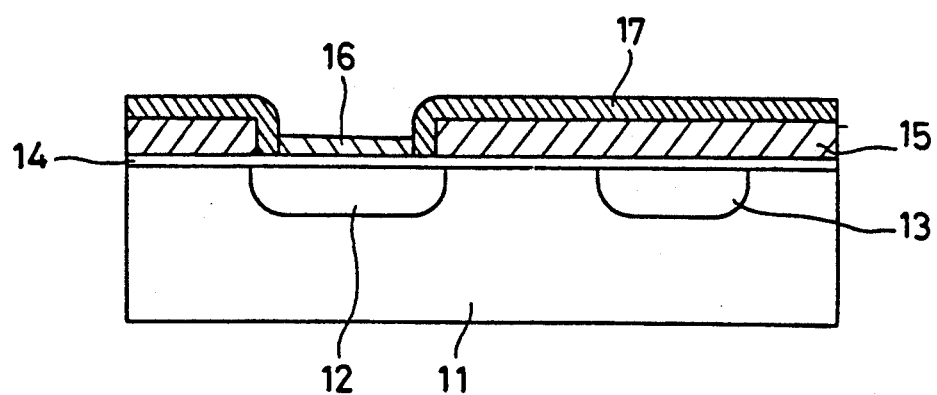

Through a heat treatment or an annealing process carried out at a temperature between 630° and 670° C. in a gas atmosphere comprised of 90% nitrogen and 10% hydrogen, the refractory metal 16 reacts as shown in the following formula (1) and the portion of the layer of refractory material overlying the polysilicon 15 is converted into a silicide layer 17 which is in contact with the gate polysilicon (see FIG. 3(C)).

$$Ti + Si = Ti_2Si \qquad (1).$$

As the refractory metal 16 does not react with oxide 14, the region of the layer of refractory metal 16 in contact with the gate oxide 14 remains unchanged. That is, the refractory metal 16 is converted into a silicide over the entire surface except the portion over the photo diode 12.

Figure 3D:
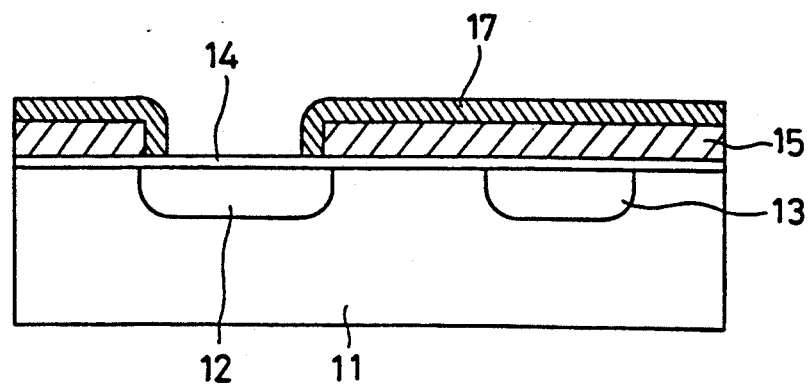

The next step is a wet etching process as shown in FIG. 3(D) for selectively etching the refractory metal 16. In the wet etching process, the refractory metal 16 is eliminated at the portion over the photo diode 12, with the silicide film 17 left untouched. The chemical etchant used in the preferred embodiment of the invention is a mixture of five parts deionized water to one part hydrogen peroxide and one part ammonium hydroxide (DI $H_2O$ : $H_2O_2$: $NH_4OH = 5 : 1 : 1$).

As a final step, a heat treatment is applied for 20 minutes at a temperature of 750° to 850° C. under an Ar atmosphere in order to stabilize the device and reduce its resistance.

Accordingly, only the portion of the refractory layer over the photo diode 12 is opened for providing a window for receiving light.

It is noted that dry etching can be performed instead of the wet etching for removing or eliminating the refractory metal.

The effects in accordance with the present invention are as follows.

First, as the refractory metal 16 is converted into the silicide film 17 in the region in contact with the gate polysilicon 17, light cannot impinge upon portions other than the photo diode 12. Accordingly, the incident light upon the gate polysilicon is shielded.

Particularly, as the silicide film 17 is produced vertically on both sides of the photo diode 12 by self-arrangement, the incidence of light upon the vertical side faces of the etched gate polysilicon 15 is prevented.

Consequently, an optical smear phenomenon which may be produced by the infiltration of the signal of light charge into the transmission region, VCCD through the gate polysilicon, is completely prevented.

Secondly, a light-shielding layer of aluminum 7 stacked by vacuum evaporation on the gate polysilicon 5 disclosed in the prior art, is not utilized in this invention so that the reduction in size of or loss of the opening area of the photo diode 2 is prevented, whereby the fill factor of the photo diode 2 may be maximized.

As can be seen by the above description, the process of the present invention is well adapted to achieve the objects and advantages mentioned as well as those inherent therein. While the presently preferred embodiments of the present invention have been described for the purpose of disclosure, numerous changes can be made by those skilled in the art, which changes are encompassed within the spirit of this invention as defined by the appended claims.

What is claimed is:

1. A process for producing a self-alignment type CCD image sensor comprising the steps of:
providing a light-receiving region and a transmission region by injecting ions into a substrate at a predetermined distance, the injected ions being different in type from the substrate;
covering the surface of the substrate with a gate oxide and a gate polysilicon, the gate polysilicon being over the gate oxide, then eliminating the gate polysilicon only at the portion over the photo-receiving region through photo and etching processes;
producing a refractory metal on the whole etched surface by vacuum evaporation and then converting the refractory metal into a silicide at the portion in contact with the gate polysilicon through annealing process; and
eliminating the refractory metal at the unconverted portion which remains on the gate oxide through a predetermined etching process.

2. The process of claim 1 wherein Mo is used as the refractory metal.

3. The process of claim 1 wherein Pt is used as the refractory metal.

4. The process of claim 1 wherein Ti is used as the refractory metal.

5. A process for producing a self-alignment type CCD image sensor comprising the steps of:
providing a light-receiving region and a transmission region by injecting ions into a substrate at a predetermined distance, the injected ions being different in type from the substrate;
covering the surface of the substrate with a gate oxide layer and a gate polysilicon layer, the gate polysilicon layer being deposited over the gate oxide layer, then removing the gate polysilicon layer only from the region over the light-receiving region;
depositing a refractory metal layer over the whole etched surface by vacuum evaporation and then annealing the refractory metal into a silicide in the region thereof which is in contact with the gate polysilicon; and removing the refractory metal from the unconverted portion of the refractory metal layer which overlies the gate oxide layer.

6. The process of claim 5 wherein the refractory metal is selected from the group comprised of Mo, Pt, or Ti.

7. The process of claim 5 wherein the process for removing the gate polysilicon layer is a dry etching process.

8. The process of claim 7 wherein the dry etching process is a reactive ion etching process.

9. The process of claim 5 wherein the process for removing the unconverted refractory metal is a wet etching process.

10. The process of claim 9 wherein the wet etching process is carried out with an etchant mixture of deionized water, hydrogen peroxide and ammonium hydroxide.

11. The process of claim 5 wherein the light receiving region is a photo diode.

12. The process of claim 5 wherein the light receiving region is a Schottky diode.

13. The process of claim 5 wherein the light transmission region is a vertical charge coupled device.

14. The process of claim 5 wherein the light transmission region is a buried charge coupled device.

15. The process of claim 5 wherein a heat treating step is performed on the sensor as a final step.

* * * * *